(12) United States Patent
Park et al.

(10) Patent No.: US 8,053,793 B2
(45) Date of Patent: Nov. 8, 2011

(54) III-NITRIDE SEMICONDUCTOR LIGHT EMITTING DEVICE

(75) Inventors: Eun Hyun Park, Seongnam-si (KR); Tae-Kyung Yoo, Yongin-si (KR)

(73) Assignee: Epivalley Co., Ltd., Kyungsangbuk-do (KR)

( * ) Notice: Subject to any disclaimer, the term of this patent is extended or adjusted under 35 U.S.C. 154(b) by 342 days.

(21) Appl. No.: 12/084,198

(22) PCT Filed: Oct. 30, 2006

(86) PCT No.: PCT/KR2006/004457
§ 371 (c)(1),
(2), (4) Date: Oct. 1, 2009

(87) PCT Pub. No.: WO2007/049946
PCT Pub. Date: May 3, 2007

(65) Prior Publication Data
US 2010/0012920 A1   Jan. 21, 2010

(30) Foreign Application Priority Data
Oct. 28, 2005   (KR) .................. 10-2005-0102063

(51) Int. Cl.
*H01L 33/00* (2010.01)
(52) U.S. Cl. ............... 257/95; 257/98; 257/E33.026
(58) Field of Classification Search ............ 257/13, 257/95, E33.026
See application file for complete search history.

(56) References Cited

U.S. PATENT DOCUMENTS

| | | | |
|---|---|---|---|
| 5,055,894 A * | 10/1991 | Chan ......................... | 257/85 |
| 5,122,845 A | 6/1992 | Manabe et al. | |
| 5,247,533 A | 9/1993 | Okazaki et al. | |
| 5,290,393 A | 3/1994 | Nakamura | |
| 5,306,662 A | 4/1994 | Nakamura et al. | |
| 5,563,422 A | 10/1996 | Nakamura et al. | |
| 5,652,434 A | 7/1997 | Nakamura et al. | |
| 5,733,796 A | 3/1998 | Manabe et al. | |
| 6,194,743 B1 | 2/2001 | Kondoh et al. | |
| 6,462,357 B1 | 10/2002 | Tsai et al. | |
| 6,498,111 B1 | 12/2002 | Kapolnek et al. | |
| 6,515,306 B2 | 2/2003 | Kuo et al. | |
| 6,791,117 B2 * | 9/2004 | Yoshitake et al. ............. | 257/94 |
| 6,861,270 B2 | 3/2005 | Sakai | |
| 7,087,924 B2 * | 8/2006 | Wu et al. ....................... | 257/22 |
| 7,345,323 B2 * | 3/2008 | Goetz et al. .................. | 257/101 |

(Continued)

FOREIGN PATENT DOCUMENTS

JP   2000-101135   4/2000

(Continued)

*Primary Examiner* — N Drew Richards
*Assistant Examiner* — Grant Withers
(74) *Attorney, Agent, or Firm* — Harness, Dickey & Pierce, P.L.C.; Michael J. Thomas; Kisuk Lee

(57) ABSTRACT

The present invention discloses a III-nitride compound semiconductor light emitting device including an active layer for generating light by recombination of an electron and a hole between an n-type nitride compound semiconductor layer and a p-type nitride compound semiconductor layer. The active layer is disposed over the n-type nitride compound semiconductor layer. The III-nitride compound semiconductor light emitting device includes a masking film made of MgN and grown on the p-type nitride compound semiconductor layer, and at least one nitride compound semiconductor layer grown after the growth of the masking film made of MgN.

10 Claims, 2 Drawing Sheets

U.S. PATENT DOCUMENTS

| | | | |
|---|---|---|---|
| 7,427,785 B2 * | 9/2008 | Song .................................. | 257/99 |
| 7,723,739 B2 * | 5/2010 | Takano et al. ..................... | 257/95 |
| 7,755,094 B2 * | 7/2010 | Kim et al. ......................... | 257/79 |
| 7,820,463 B2 * | 10/2010 | Song .................................. | 438/29 |
| 7,825,432 B2 * | 11/2010 | Saxler et al. .................... | 257/190 |
| 7,868,316 B2 * | 1/2011 | Yoon et al. ....................... | 257/15 |
| 7,928,449 B2 * | 4/2011 | Kim et al. ........................ | 257/79 |
| 7,935,974 B2 * | 5/2011 | Kim et al. ........................ | 257/96 |
| 2003/0218179 A1 * | 11/2003 | Koide et al. ...................... | 257/95 |
| 2006/0038190 A1 * | 2/2006 | Park et al. ....................... | 257/95 |
| 2006/0038193 A1 * | 2/2006 | Wu et al. ......................... | 257/98 |
| 2006/0049418 A1 * | 3/2006 | Wen et al. ....................... | 257/98 |
| 2008/0073657 A1 * | 3/2008 | Liang et al. ..................... | 257/89 |
| 2008/0283865 A1 * | 11/2008 | Yoo et al. ....................... | 257/103 |
| 2009/0159924 A1 * | 6/2009 | Kamiyama et al. ............ | 257/103 |
| 2009/0197397 A1 * | 8/2009 | Park et al. ...................... | 438/478 |
| 2009/0206362 A1 * | 8/2009 | Sung et al. ...................... | 257/103 |
| 2009/0250685 A1 * | 10/2009 | Moon .............................. | 257/13 |
| 2010/0032689 A1 * | 2/2010 | Park et al. ....................... | 257/87 |
| 2010/0052009 A1 * | 3/2010 | Shim ............................... | 257/103 |
| 2010/0102353 A1 * | 4/2010 | Park ................................ | 257/98 |
| 2011/0037049 A1 * | 2/2011 | Tachibana et al. .............. | 257/13 |

FOREIGN PATENT DOCUMENTS

| | | |
|---|---|---|
| JP | 2005-294794 | 10/2005 |
| WO | 02/21121 | 3/2002 |
| WO | 2005/022655 | 3/2005 |
| WO | 2005/053042 | 6/2005 |

\* cited by examiner

[Figure 1]
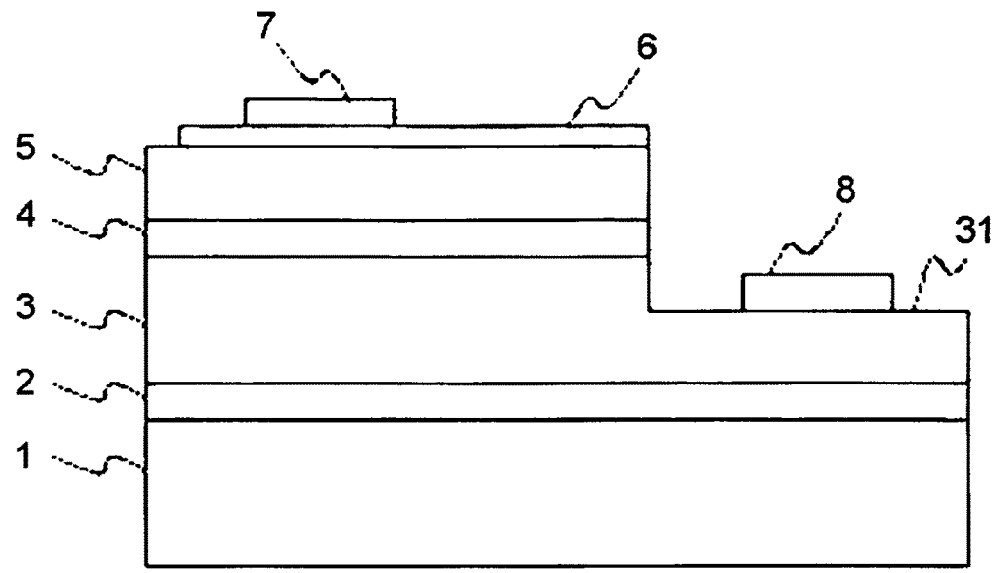
[Figure 2]
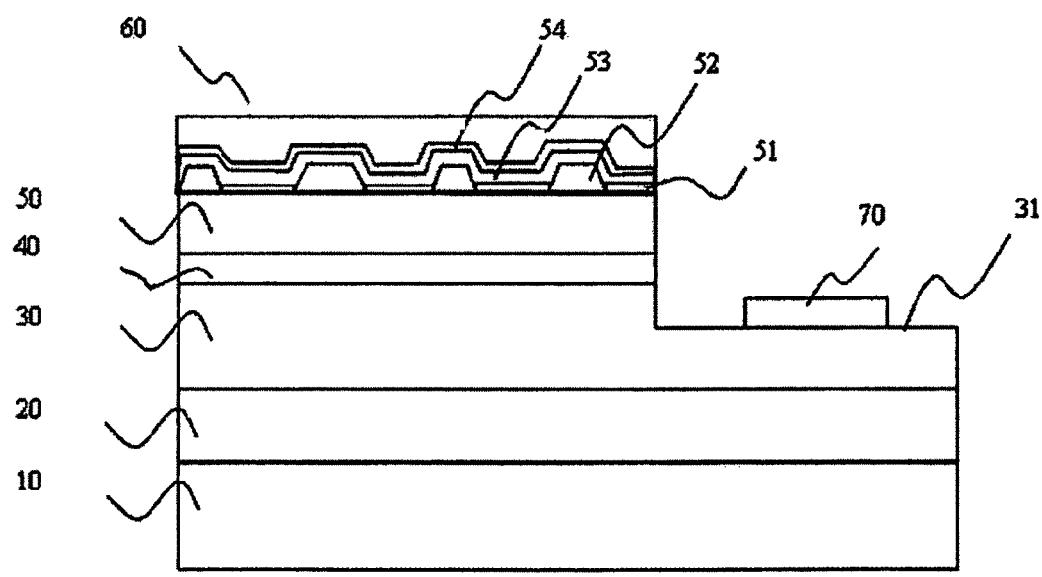

[Figure 3]
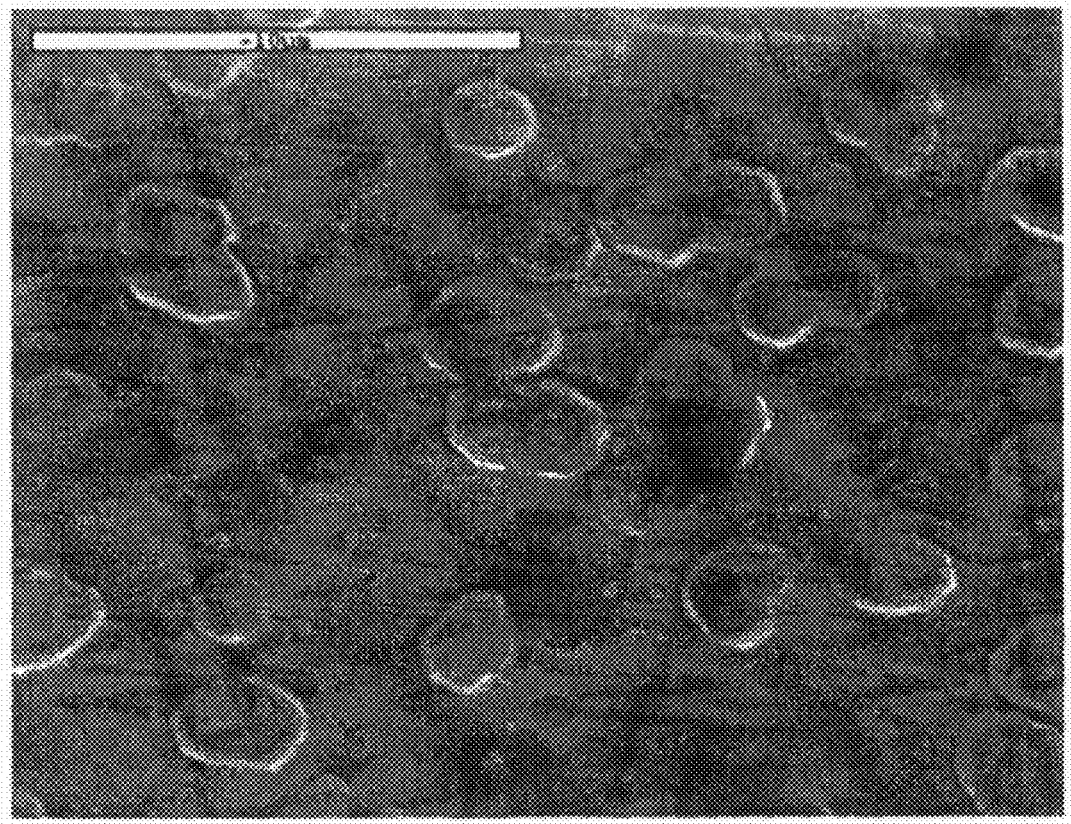

ized or clear that a description here is omitted for simplicity.

III-NITRIDE SEMICONDUCTOR LIGHT EMITTING DEVICE

CROSS-REFERENCE TO RELATED APPLICATIONS

This application is a U.S. national stage filing under 35 U.S.C. §371 of International Application No. PCT/KR2006/004457 filed Oct. 30, 2006, and claims priority to Korean Application No. 10-2005-0102063 filed Oct. 28, 2005. The disclosures of the aforementioned applications are incorporated herein by reference in their entireties.

TECHNICAL FIELD

The present invention relates to a III-nitride compound semiconductor light emitting device, and more particularly, to a III-nitride compound semiconductor light emitting device which improves external quantum efficiency and has a low driving voltage, by forming an island-like (or irregular) nitride compound semiconductor layer inside a nitride compound semiconductor layer. Here, III-nitride compound semiconductor light emitting device means a light emitting device such as a light emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material consisting of other group elements, such as SiC, SiN, SiCN and CN, and a semiconductor layer made of the material.

BACKGROUND ART

FIG. 1 is a cross-sectional view illustrating one example of a conventional semiconductor light emitting device. The conventional semiconductor light emitting device includes a substrate 100, a buffer layer 200 epitaxially grown on the substrate 100, an n-type nitride compound semiconductor layer 300 epitaxially grown on the buffer layer 200, an active layer 400 epitaxially grown on the n-type nitride compound semiconductor layer 300, a p-type nitride compound semiconductor layer 500 epitaxially grown on the active layer 400, a p-side electrode 600 formed on the, p-type nitride compound semiconductor layer 500, a p-side bonding pad 700 formed on the p-side electrode 600, and an n-side electrode 800 formed on the n-type nitride compound semiconductor layer 301 exposed by mesa-etching the p-type nitride compound semiconductor layer 500 and the active layer 400.

In the case of the substrate 100, a GaN substrate can be used as a homo-substrate, and a sapphire substrate, an SiC substrate or an Si substrate can be used as a hetero-substrate. However, any kinds of substrates on which the nitride compound semiconductor layers can be grown can be used.

The nitride compound semiconductor layers epitaxially grown on the substrate 100 are mostly grown by the metal organic chemical vapor deposition (MOCVD).

The buffer layer 200 serves to overcome differences in lattice parameter and thermal expansion coefficient between the hetero-substrate 100 and the nitride compound semiconductor. U.S. Pat. No. 5,122,845 discloses a method for growing an AlN buffer layer having a thickness of 100 to 500 Å on a sapphire substrate at 380 to 800° C. U.S. Pat. No. 5,290,393 discloses a method for growing an $Al_{(x)}Ga_{(1-x)}N$ ($0 \leq x \leq 1$) buffer layer having a thickness of 10 to 5000 Å □ on a sapphire substrate at 200 to 900° C. The international publication official gazette WO/05/053042 discloses a method for growing an SiC buffer layer (seed layer) at 600 to 990° C., and growing an $In_{(x)}Ga_{(1-x)}N$ ($0<x \leq 1$) layer thereon.

In the n-type nitride compound semiconductor layer 300, at least the n-side electrode 800 formed region (n-type contact layer) is doped with a dopant. Preferably, the n-type contact layer is made of GaN and doped with Si. U.S. Pat. No. 5,733,796 discloses a method for doping an n-type contact layer at a target doping concentration by controlling a mixture ratio of Si and other source material.

The active layer 400 generates light quantum (light) by recombination of an electron and a hole. Normally, the active layer 400 is made of $In_{(x)}Ga_{(1-x)}N$ ($0<x \leq 1$) and comprised of single quantum well layer or multi quantum well layers. The international publication official gazette WO/02/021121 discloses a method for partially doping a plurality of quantum well layers and barrier layers.

The p-type nitride compound semiconductor layer 500 is doped with an appropriate dopant such as Mg, and provided with p-type conductivity by activation. U.S. Pat. No. 5,247,533 discloses a method for activating a p-type nitride compound semiconductor layer by electron beam radiation. U.S. Pat. No. 5,306,662 discloses a method for activating a p-type nitride compound semiconductor layer by annealing over 400° C. Also, the international publication official gazette WO/05/022655 discloses a method for endowing a p-type nitride compound semiconductor layer with p-type conductivity without activation, by using ammonia and a hydrogen group source material as a nitrogen precursor for the growth of the p-type nitride compound semiconductor layer.

The p-side electrode 600 facilitates current supply to the whole p-type nitride compound semiconductor layer 500. U.S. Pat. No. 5,563,422 discloses a light transmittable electrode formed almost on the whole surface of a p-type nitride compound semiconductor layer to ohmic-contact the p-type nitride compound semiconductor layer, and composed of Ni and Au. U.S. Pat. No. 6,515,306 discloses a method for forming an n-type super lattice layer on a p-type nitride compound semiconductor layer, and forming a light transmittable electrode made of ITO thereon.

On the other hand, the p-side electrode 600 can be formed thick not to transmit light, namely, to reflect light to the substrate side. A light emitting device using the p-side electrode 600 is called a flip chip. U.S. Pat. No. 6,194,743 discloses an electrode structure including an Ag layer having a thickness 20 nm and over, a diffusion barrier layer for covering the Ag layer, and a bonding layer made of Au and Al for covering the diffusion barrier layer.

The p-side bonding pad 700 and the n-side electrode 800 are formed for current supply and external wire bonding. U.S. Pat. No. 5,563,422 discloses a method for forming an n-side electrode with Ti and Al, and U.S. Pat. No. 5,652,434 discloses a method for making a p-side bonding pad directly contact a p-type nitride compound semiconductor layer by removing a part of a light transmittable electrode.

One of the disadvantages of the III-nitride compound semiconductor light emitting device is that a large amount of light generated in the active layer 400 is confined inside the device and the substrate 100 due to a refractive index difference between the device and the ambient air.

In the device showing serious light confinement, namely, the device having low external quantum efficiency, a large amount of light is confined and vanished as heat. Accordingly, a temperature of the device rises, which affects the lifespan and property of the device.

External quantum efficiency can be improved by mechanically processing a chip shape of the light emitting device, or roughening the surface of the semiconductor layer by chemical etching or dry etching. Recently, in the growth of the p-type nitride compound semiconductor layer 500, the surface is roughened with deteriorating quality of thin film by using the growth conditions such as pressure, temperature and gas flow.

The mechanical processing is suitable for the substrate having low hardness such as SiC. However, it is difficult to mechanically process the substrate having high hardness such as sapphire. In addition, when the surface of the semiconductor layer is roughened by chemical etching or dry etching, the roughenable area is limited and reproducibility and uniformity are reduced.

In the case that the surface of the p-type nitride compound semiconductor layer 500 is roughened by changing the growth conditions, external quantum efficiency of the device can be improved, but reliability thereof may be seriously reduced.

DISCLOSURE

Technical Problem

The present invention is achieved in consideration of the above problems. An object of the present invention is to provide a III-nitride compound semiconductor light emitting device which has a new structure of increasing external emission of light generated in an active layer.

Technical Solution

In order to achieve the above-described object of the invention, there is provided a III-nitride compound semiconductor light emitting device including an active layer for generating light by recombination of an electron and a hole between an n-type nitride compound semiconductor layer and a p-type nitride compound semiconductor layer, the active layer being disposed over the n-type nitride compound semiconductor layer, the III-nitride compound semiconductor light emitting device including a masking film made of MgN and grown over the p-type nitride compound semiconductor layer, and at least one nitride compound semiconductor layer grown after the growth of the masking film made of MgN.

In another aspect of the present invention, at least one nitride compound semiconductor layer includes a first $Al_xIn_yGa_zN$ ($x+y+z=1$) layer.

In another aspect of the present invention, the first $Al_xIn_yGa_zN$ ($x+y+z=1$) layer is composed of a plurality of islands.

In another aspect of the present invention, at least one nitride compound semiconductor layer includes a first $Al_aIn_bGa_cN$ ($a+b+c=1$) layer and a second $Al_aIn_bGa_cN$ ($a+b+c=1$) layer, and the second $Al_aIn_bGa_cN$ ($a+b+c=1$) layer covers the whole surfaces of the masking film made of MgN and the first $Al_aIn_bGa_cN$ ($a+b+c=1$) layer.

In another aspect of the present invention, at least one nitride compound semiconductor layer further includes a third $Al_eIn_fGa_gN$ ($e+f+g=1$) layer grown over the second $Al_aIn_bGa_cN$ ($a+b+c=1$) layer.

In another aspect of the present invention, the second $Al_aIn_bGa_cN$ ($a+b+c=1$) layer is grown at a first temperature, the third $Al_eIn_fGa_gN$ ($e+f+g=1$) layer is grown at a second temperature, and the first temperature is lower than the second temperature.

In another aspect of the present invention, at least one nitride compound semiconductor layer includes a first $Al_xIn_yGa_zN$ ($x+y+z=1$) layer, a second $Al_aIn_bGa_cN$ ($a+b+c=1$) layer and a third $Al_eIn_fGa_gN$ ($e+f+g=1$) layer, and the first $Al_xIn_yGa_zN$ ($x+y+z=1$) layer, the second $Al_aIn_bGa_cN$ ($a+b+c=1$) layer and the third $Al_eIn_fGa_gN$ ($e+f+g=1$) layer have p-type conductivity.

In another aspect of the present invention, at least one of the first $Al_xIn_yGa_zN$ ($x+y+z=1$) layer, the second $Al_aIn_bGa_cN$ ($a+b+c=1$) layer and the third $Al_eIn_fGa_gN$ ($e+f+g=1$) layer has a stack structure of a nitride compound semiconductor layer having p-type conductivity and a nitride compound semiconductor layer having n-type conductivity with thickness below 100 Å.

In another aspect of the present invention, at least one nitride compound semiconductor layer includes an $Al_xIn_yGa_zN$ ($x+y+z=1$) layer composed of a plurality of islands and a supplementary $Al_eIn_fGa_gN$ ($e+f+g=1$) layer for covering the masking film made of MgN and the $Al_xIn_yGa_zN$ ($x+y+z=1$) layer composed of the plurality of islands.

In another aspect of the present invention, at least one nitride compound semiconductor layer further includes an $Al_aIn_bGa_cN$ ($a+b+c=1$) layer grown between the $Al_xIn_yGa_zN$ ($x+y+z=1$) layer composed of the plurality of islands and the supplementary $Al_eIn_fGa_gN$ ($e+f+g=1$) layer, at a lower temperature than the supplementary $Al_eIn_fGa_gN$ ($e+f+g=1$) layer.

Advantageous Effects

In accordance with a III-nitride compound semiconductor light emitting device of the present invention, external quantum efficiency of the III-nitride compound semiconductor light emitting device can be improved by forming the island-like (or unevenness) nitride compound semiconductor layer over the p-type nitride compound semiconductor layer at the upper portion of the active layer.

DESCRIPTION OF DRAWINGS

FIG. 1 is a cross-sectional view illustrating one example of a conventional semiconductor light emitting device;

FIG. 2 is a cross-sectional view illustrating a III-nitride compound semiconductor light emitting device in accordance with a preferred embodiment of the present invention; and FIG. 3 is a photograph showing a surface of a third $Al_eIn_fGa_gN$ ($e+f+g=1$) layer grown in accordance with the preferred embodiment of the present invention.

MODE FOR INVENTION

The present invention will now be described in detail with reference to the accompanying drawings.

FIG. 2 is a cross-sectional view illustrating the III-nitride compound semiconductor light emitting device in accordance with the present invention. The III-nitride compound semiconductor light emitting device includes a substrate 10, a buffer layer 20 epitaxially grown on the substrate 10, an n-type nitride compound semiconductor layer 30 epitaxially grown on the buffer layer 20, an active layer 40 epitaxially grown on the n-type nitride compound semiconductor layer 30, a p-type nitride compound semiconductor layer 50 epitaxially grown on the active layer 40, a MgN masking film 51 grown on the p-type nitride compound semiconductor layer 50, a first $Al_xIn_yGa_zN$ ($x+y+z=1$) layer 52 grown after the growth of the MgN masking film 51, a second $Al_aIn_bGa_cN$ ($a+b+c=1$) layer 53 grown after the growth of the first $Al_xIn_yGa_zN$ ($x+y+z=1$) layer 52, a third $Al_eIn_fGa_gN$ ($e+f+g=1$) layer 54 grown after the growth of the second $Al_aIn_bGa_cN$ ($a+b+c=1$) layer 53, a light transmittable electrode 60 formed on the third $Al_eIn_fGa_gN$ ($e+f+g=1$) layer 54, and an n-side electrode 70 formed on the n-type nitride compound semiconductor layer 31 exposed by mesa-etching the p-type nitride compound semiconductor layer 50 and the active layer 40.

The light transmittable electrode 60 includes at least one selected from the group consisting of Ni, Au, Ag, Cr, Ti, Pt, Pd, Rh, Ir, Al, Sn, ITO, In, Ta, Cu, Co, Fe, Ru, Zr, W and Mo.

In the conventional light emitting device, the p-type nitride compound semiconductor layer is formed flat. Therefore, light generated in the active layer is refracted into the light emitting device. In accordance with the present invention, the first $Al_xIn_yGa_zN$ (x+y+z=1) layer 52 composed of a plurality of islands is formed on the p-type nitride compound semiconductor layer 50, so that light generated in the active layer 40 can be externally emitted from the light emitting device by the islands. As a result, external quantum efficiency of the light emitting device can be improved. The second $Al_aIn_bGa_cN$ (a+b+c=1) layer 53 and the third $Al_eIn_fGa_gN$ (e+f+g=1) layer 54 with high quality are grown to form a uniform contact layer on the whole surface, thereby stabilizing the electrical property of the device.

The process of forming the masking film 51 made of MgN, the first $Al_xIn_yGa_zN$ (x+y+z=1) layer 52, the second $Al_aIn_bGa_cN$ (a+b+c=1) layer 53 and the third $Al_eIn_fGa_gN$ (e+f+g=1) layer 54 will now be described in detail.

1. Formation of masking film 51 made of MgN

To form the masking film 51 made of MgN, Cp2Mg which is a kind of metal organic sources is used as a Mg supply source, and ammonia or DMHy is used as a N supply source. It is of course that other materials can be adopted as the Mg supply source and the N supply source.

When a MgN layer is grown on the p-type nitride compound semiconductor layer, ammonia, a hydrazine source, or the ammonia and the hydrazine source are used as the N supply source. Accordingly, metal conglomeration is restricted in the p-type nitride compound semiconductor layer 50 during the growth of the masking film 51 made of MgN. That is, since the N group is continuously supplied during the growth of the masking film 51 made of MgN, N can be prevented from separating from the p-type nitride compound semiconductor layer 50.

The main reason for using the masking film 51 made of MgN is that Mg generally serves as a p-type dopant of the nitride compound semiconductor layer and the masking film 51 made of MgN serves to prevent hole concentration of the succeeding layers from being reduced by a memory effect.

In the case that a material containing Si and C (SiCN, CN, SiN) is used as the masking film, such elements serve as an n-type dopant and give the memory effect to the succeeding layers, to reduce the hole concentration. Therefore, a sufficient purge time is required.

The masking film 51 made of MgN can be formed in various shapes such as crystal, amorphous and poly-crystal shapes. The masking film 51 made of MgN is grown at a temperature ranging from 300 to 1200° C. which is a general growth temperature of the nitride compound semiconductor layer, preferably, at a temperature ranging from 400 to 1100° C. If the growth temperature is 300° C. and below, Mg and N can not be easily coupled to each other, and if the growth temperature is over 1200° C., decomposition occurs during the growth.

Preferably, the thickness of the masking film 51 made of MgN ranges from 2 to 1000 Å. If the thickness of the masking film 51 increases, quality of the first $Al_xIn_yGa_zN$ (x+y+z=1) layer 52 grown on the masking film 51 is deteriorated, and density of the irregular parts is reduced. Accordingly, the thickness of the masking film 51 is preferably 1000 Å and below. If the thickness of the masking film 51 is below 2 Å the masking film 51 does not normally serve as a mask. The masking film 51 made of MgN forms a random discontinuous non-uniform layer and serves as a mask, so that the first $Al_xIn_yGa_zN$ (x+y+z=1) layer 52 can form the plurality of islands.

2. Formation of first $Al_xIn_yGa_zN$ (x+y+z=1) layer 52

Referring to FIG. 2, when the first $Al_xIn_yGa_zN$ (x+y+z=1) layer 52 is grown after the growth of the masking film 51 made of MgN, the masking film 51 made of MgN serves as a mask, so that the first $Al_xIn_yGa_zN$ (x+y+z=1) layer 52 cannot be formed on the mask. Therefore, the first $Al_xIn_yGa_zN$ (x+y+z=1) layer 52 is composed of the plurality of islands grown on the regions on which the masking film 51 made of MgN has not been formed. It is similar to waterdrops formed when water falls on a non-wettable material.

In the case that the first $Al_xIn_yGa_zN$ (x+y+z=1) layer 52 is grown by the MOCVD after the growth of the masking film 51 made of MgN, the first $Al_xIn_yGa_zN$ (x+y+z=1) layer 52 can be converted from a general Ga-Face into a N-Face.

Preferably, the thickness of the first $Al_xIn_yGa_zN$ (x+y+z=1) layer 52 ranges from 100 to 10000 Å. If the thickness of the first $Al_xIn_yGa_zN$ (x+y+z=1) layer 52 is below 100 Å it cannot easily form the island shape, and if the thickness of the first $Al_xIn_yGa_zN$ (x+y+z=1) layer 52 is over 10000 Å quality of the thin film is reduced. Preferably, a growth temperature ranges from 600 to 1100° C. If the growth speed is below 600° C., the first $Al_xIn_yGa_zN$ (x+y+z=1) layer 52 is grown on the masking film 51, and if the growth temperature is over 1100° C., the first $Al_xIn_yGa_zN$ (x+y+z=1) layer 52 is decomposed.

The first $Al_xIn_yGa_zN$ (x+y+z=1) layer 52 is not essentially the nitride compound semiconductor layer having p-type conductivity. The first $Al_xIn_yGa_zN$ (x+y+z=1) layer 52 can be formed by inserting single or multi nitride compound semiconductor layers having n-type conductivity. In this case, the thickness of the nitride compound semiconductor layer having n-type conductivity is preferably below 100 Å in consideration of a tunneling effect of holes.

3. Formation of second $Al_aIn_bGa_cN$ (a+b+c=1) layer 53

After the first $Al_xIn_yGa_zN$ (x+y+z=1) layer 52 is grown to form the plurality of islands, when the second $Al_aIn_bGa_cN$ (a+b+c=1) layer 53 is grown in the growth condition of lowering mobility of the nitride compound semiconductor layer, the second $Al_aIn_bGa_cN$ (a+b+c=1) layer 53 is grown not only on the first $Al_xIn_yGa_zN$ (x+y+z=1) layer 52 but also on the masking film 51 made of MgN. The third $Al_eIn_fGa_gN$ (e+f+g=1) layer 54 which is a contact layer can be uniformly formed on the second $Al_aIn_bGa_cN$ (a+b+c=1) layer 53, thereby obtaining the light emitting device having a stable and low driving voltage.

A low growth temperature is advantageous for the second $Al_aIn_bGa_cN$ (a+b+c=1) layer 53. However, preferably, the second $Al_aIn_bGa_cN$ (a+b+c=1) layer 53 is grown at a temperature of 400 to 1000° C. in consideration of p-type doping. In addition, preferably, the thickness of the second $Al_aIn_bGa_cN$ (a+b+c=1) layer 53 ranges from 5 to 5000 Å □ in consideration of quality of the thin film.

The second $Al_aIn_bGa_cN$ (a+b+c=1) layer 53 is not essentially the nitride compound semiconductor layer having p-type conductivity. The second $Al_aIn_bGa_cN$ (a+b+c=1) layer 53 can be formed by inserting single or multi nitride compound semiconductor layers having n-type conductivity. In this case, the thickness of the nitride compound semiconductor layer having n-type conductivity is preferably below 100 Å □ in consideration of the tunneling effect of holes.

4. Formation of third $Al_eIn_fGa_gN$ (e+f+g=1) layer 54

Preferably, the third $Al_eIn_fGa_gN$ (e+f+g=1) layer 54 which is the contact layer is grown in the condition of obtaining high hole concentration. Since the second $Al_aIn_bGa_cN$ (a+b+c=1) layer 53 has been uniformly formed on the masking film 51 made of MgN and the first $Al_xIn_yGa_zN$ (x+y+z=1) layer 52, the third $Al_eIn_fGa_gN$ (e+f+g=1) layer 54 can be uniformly grown even at a high temperature of growing a high quality nitride compound semiconductor layer.

If the third $Al_eIn_fGa_gN$ (e+f+g=1) layer 54 is grown without the second $Al_aIn_bGa_cN$ (a+b+c=1) layer 53, the third $Al_eIn_fGa_gN$ (e+f+g=1) layer 54 can not be formed on the masking film 51 made of MgN. As a result, the third $Al_eIn_fGa_gN$ (e+f+g=1) layer 54 cannot form a uniform contact layer, and thus cannot attain a stable electrical property.

Preferably, the thickness of the third $Al_eIn_fGa_gN$ (e+f+g=1) layer 54 ranges from 10 to 5000 Å. If the thickness of the third $Al_eIn_fGa_gN$ (e+f+g=1) layer 54 is below 10 Å □ or over 5000 Å, quality of the thin film is reduced. Preferably, a growth temperature of the third $Al_eIn_fGa_gN$ (e+f+g=1) layer 54 ranges from 700 to 1100° C. If the growth temperature is below 700° C., the third $Al_eIn_fGa_gN$ (e+f+g=1) layer 54 has a polycrystalline property, and if the growth temperature is over 1100° C., the third $Al_eIn_fGa_gN$ (e+f+g=1) layer 54 is decomposed during the growth.

FIG. 3 is a photograph showing the surface of the third $Al_eIn_fGa_gN$ (e+f+g=1) layer grown in accordance with the present invention. As shown in FIG. 3, the second $Al_aIn_bGa_cN$ (a+b+c=1) layer 53 and the third $Al_eIn_fGa_gN$ (e+f+g=1) layer 54 are uniformly grown, and the islands (or unevenness) are formed by the first $Al_xIn_yGa_zN$ (x+y+z=1) layer 52.

The masking film 51 made of MgN is grown on the p-type nitride compound semiconductor layer 50, and the first $Al_xIn_yGa_zN$ (x+y+z=1) layer 52 is grown thereon, which increases a forward voltage. It is possible to form the structure only to the first $Al_xIn_yGa_zN$ (x+y+z=1) layer 52 according to the application field of the light emitting device.

The masking film 51 made of MgN is grown on the p-type nitride compound semiconductor layer 50, the first $Al_xIn_yGa_zN$ (x+y+z=1) layer 52 is grown thereon, and the second $Al_aIn_bGa_cN$ (a+b+c=1) layer 53 is grown thereon, which increases a forward voltage. It is also possible to form the structure only to the second $Al_aIn_bGa_cN$ (a+b+c=1) layer 53 according to the application field of the light emitting device.

In addition, the first $Al_xIn_yGa_zN$ (x+y+z=1) layer 52, the second $Al_aIn_bGa_cN$ (a+b+c=1) layer 53 and the third $Al_eIn_fGa_gN$ (e+f+g=1) layer 54 can have the stack structure of a nitride compound semiconductor layer having p-type conductivity and a nitride compound semiconductor layer having n-type conductivity. In this case, preferably, the thickness of the n-type nitride compound semiconductor layer is below 100 Å in consideration of the tunneling effect of holes.

The invention claimed is:

1. A III-nitride compound semiconductor light emitting device including an active layer for generating light by recombination of an electron and a hole between an n-type nitride compound semiconductor layer and a p-type nitride compound semiconductor layer, the active layer being disposed over the n-type nitride compound semiconductor layer, comprising:
   a masking film made of MgN and grown on the p-type nitride compound semiconductor layer; and
   at least one nitride compound semiconductor layer grown after the growth of the masking film made of MgN.

2. The III-nitride compound semiconductor light emitting device of claim 1,
   wherein the at least one nitride compound semiconductor layer comprises a first $Al_xIn_yGa_zN$ (x+y+z=1) layer.

3. The III-nitride compound semiconductor light emitting device of claim 2,
   wherein the first $Al_xIn_yGa_zN$ (x+y+z=1) layer is composed of a plurality of islands.

4. The III-nitride compound semiconductor light emitting device of claim 1,
   wherein the at least one nitride compound semiconductor layer comprises a first $Al_aIn_bGa_cN$ (a+b+c=1) layer and a second $Al_aIn_bGa_cN$ (a+b+c=1) layer, and the second $Al_aIn_bGa_cN$ (a+b+c=1) layer covers the whole surfaces of the masking film made of MgN and the first $Al_aIn_bGa_cN$ (a+b+c=1) layer.

5. The III-nitride compound semiconductor light emitting device of claim 4,
   wherein the at least one nitride compound semiconductor layer further comprises a third $Al_eIn_fGa_gN$ (e+f+g=1) layer grown on the second $Al_aIn_bGa_cN$ (a+b+c=1) layer.

6. The III-nitride compound semiconductor light emitting device of claim 5,
   wherein the second $Al_aIn_bGa_cN$ (a+b+c=1) layer is grown at a first temperature, the third $Al_eIn_fGa_gN$ (e+f+g=1) layer is grown at a second temperature, and the first temperature is lower than the second temperature.

7. The III-nitride compound semiconductor light emitting device of claim 1,
   wherein the at least one nitride compound semiconductor layer comprises a first $Al_xIn_yGa_zN$ (x+y+z=1) layer, a second $Al_aIn_bGa_cN$ (a+b+c=1) layer and a third $Al_eIn_fGa_gN$ (e+f+g=1) layer, and the first $Al_xIn_yGa_zN$ (x+y+z=1) layer, the second $Al_aIn_bGa_cN$ (a+b+c=1) layer and the third $Al_eIn_fGa_gN$ (e+f+g=1) layer have p-type conductivity.

8. The III-nitride compound semiconductor light emitting device of claim 7,
   wherein the at least one of the first $Al_xIn_yGa_zN$ (x+y+z=1) layer, the second $Al_aIn_bGa_cN$ (a+b+c=1) layer and the third $Al_eIn_fGa_gN$ (e+f+g=1) layer has a stack structure of a nitride compound semiconductor layer having p-type conductivity and a nitride compound semiconductor layer having n-type conductivity with thickness below 100 Å.

9. The III-nitride compound semiconductor light emitting device of claim 1,
   wherein the at least one nitride compound semiconductor layer comprises an $Al_xIn_yGa_zN$ (x+y+z=1) layer composed of a plurality of islands and a supplementary $Al_eIn_fGa_gN$ (e+f+g=1) layer for covering the masking film made of MgN and the $Al_xIn_yGa_zN$ (x+y+z=1) layer composed of the plurality of islands.

10. The III-nitride compound semiconductor light emitting device of claim 9,
    wherein the at least one nitride compound semiconductor layer further includes an $Al_aIn_bGa_cN$ (a+b+c=1) layer grown between the $Al_xIn_yGa_zN$ (x+y+z=1) layer composed of the plurality of islands and the supplementary $Al_eIn_fGa_gN$ (e+f+g=1) layer, at a lower temperature than the supplementary $Al_eIn_fGa_gN$ (e+f+g=1) layer.

\* \* \* \* \*